United States Patent
Park et al.

(10) Patent No.: US 9,697,953 B2
(45) Date of Patent: Jul. 4, 2017

(54) MULTILAYER CERAMIC ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Seok Kyoon Woo, Suwon-Si (KR); Kyoung Jin Jun, Suwon-Si (KR); So Yeon Song, Suwon-Si (KR); Soon Ju Lee, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 162 days.

(21) Appl. No.: 14/667,575

(22) Filed: Mar. 24, 2015

(65) Prior Publication Data

US 2016/0118190 A1   Apr. 28, 2016

(30) Foreign Application Priority Data

Oct. 23, 2014   (KR) .................. 10-2014-0144355

(51) Int. Cl.
   *H01G 2/20*   (2006.01)
   *H01G 4/06*   (2006.01)
   (Continued)

(52) U.S. Cl.
   CPC .............. *H01G 4/30* (2013.01); *H01G 4/012* (2013.01); *H01G 4/12* (2013.01); *H01G 4/224* (2013.01);
   (Continued)

(58) Field of Classification Search
   CPC .......... H01G 4/30; H01G 4/232; H01G 4/228; H01G 4/12
   (Continued)

(56) References Cited

U.S. PATENT DOCUMENTS 9,214,283 B2 * 12/2015 Togashi ................ H01G 4/30
2009/0316330 A1   12/2009 Taniguchi et al.
(Continued)

FOREIGN PATENT DOCUMENTS

JP   11-251176 A   9/1999
JP   3847265 B2    11/2006
(Continued)

OTHER PUBLICATIONS

Office Action with translation mailed Jul. 16, 2015 in KR Patent Application No. 10-2014-0144355.

*Primary Examiner* — Eric Thomas
*Assistant Examiner* — Arun Ramaswamy
(74) *Attorney, Agent, or Firm* — McDermott Will & Emery LLP (57) ABSTRACT

There is provided a multilayer ceramic electronic component including: a multilayer ceramic capacitor (MLCC) including first and second external electrodes disposed to be spaced apart from one another on a mounting surface thereof; and first and second terminal electrodes including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on the mounting surface of the MLCC in a facing manner.

37 Claims, 10 Drawing Sheets

(51) Int. Cl.
*H01G 4/228* (2006.01)
*H01G 4/30* (2006.01)
*H01G 4/232* (2006.01)
*H01G 4/12* (2006.01)
*H01G 4/224* (2006.01)
*H01G 4/012* (2006.01)
*H05K 1/18* (2006.01)
*H05K 3/34* (2006.01)
*H05K 1/11* (2006.01)

(52) U.S. Cl.
CPC ......... *H05K 1/181* (2013.01); *H05K 3/3426* (2013.01); *H05K 1/111* (2013.01); *H05K 2201/0311* (2013.01); *H05K 2201/10015* (2013.01); *H05K 2201/10757* (2013.01); *H05K 2201/10946* (2013.01); *H05K 2201/2045* (2013.01); *Y02P 70/611* (2015.11); *Y02P 70/613* (2015.11)

(58) Field of Classification Search
USPC .......... 361/308.1, 306.3, 306.1, 321.1, 301.4
See application file for complete search history.

(56) References Cited

U.S. PATENT DOCUMENTS

| | | | |
|---|---|---|---|
| 2010/0123995 A1 | 5/2010 | Otsuka et al. | |
| 2012/0113563 A1* | 5/2012 | Kuroda | H01G 4/012 361/328 |

FOREIGN PATENT DOCUMENTS

| | | | |
|---|---|---|---|
| JP | 2009-65198 A | | 3/2009 |
| JP | 2010-123614 A | | 6/2010 |
| JP | 2012-033655 A | | 2/2012 |
| JP | 2012033651 A | * | 2/2012 |
| JP | 2012033655 A | * | 2/2012 |
| KR | 10-2014-0050210 A | | 4/2014 |

* cited by examiner

MULTILAYER CERAMIC ELECTRONIC COMPONENT AND BOARD HAVING THE SAME

CROSS-REFERENCE TO RELATED APPLICATION

This application claims the priority and benefit of Korean Patent Application No. 10-2014-0144355 filed on Oct. 23, 2014, with the Korean Intellectual Property Office, the disclosure of which is incorporated herein by reference.

BACKGROUND

The present disclosure relates to a multilayer ceramic electronic component and a board having the same.

Electronic components using a ceramic material include capacitors, inductors, piezoelectric elements, varistors, thermistors, and the like.

Among ceramic electronic components, multilayer ceramic capacitors (MLCCs), having advantages such as compactness, guaranteed high capacitance, and ease of mountability, may be used in various electronic devices.

For example, MLCCs may be used as chip-type condensers installed on the printed circuit boards (PCBs) of various electronic products such as imaging devices (or video display apparatuses) including liquid crystal displays (LCDs), plasma display panels (PDPs), and the like, as well as computers, personal digital assistants (PDAs), cellular phones, and the like, to charge or discharge electricity.

The MLCC may have a structure in which a plurality of dielectric layers and internal electrodes, the internal electrodes having opposing polarities, are alternately disposed between the dielectric layers.

Here, the dielectric layers have piezoelectric properties, and thus, when a direct current (DC) or alternating current (AC) voltage is applied to an MLCC, a piezoelectric phenomenon may occur between internal electrodes, expanding and contracting the volume of a ceramic body according to frequencies to generate periodic vibrations.

Such vibrations may be transferred to a board through external electrodes of the MLCC and solders connecting the external electrodes and the board, inducing the entirety of the board to act as an acoustically radiating surface to emit vibratory sound as noise.

Such vibratory sound may correspond to audio frequencies ranging from 20 Hz to 20000 Hz, causing listener discomfort, and such vibratory sound, causing listener discomfort, is known as acoustic noise.

In this regard, as electronic devices used with mechanical components tend to be reduced in terms of noise generation, acoustic noise generated by an MLCC may be more often perceived by listeners.

When an operating environment of a device is significantly noise-free, a user may consider acoustic noise to be abnormal, recognizing it as a fault of the device.

In addition, in a device having a voice communications function, acoustic noise overlapping audio output may degrade quality of the device.

SUMMARY

An aspect of the present disclosure may provide a multilayer ceramic electronic component in which acoustic noise is reduced, and a board having the same.

According to an aspect of the present disclosure, a multilayer ceramic electronic component may include: a multilayer ceramic capacitor (MLCC) including first and second external electrodes disposed to be spaced apart from one another on a mounting surface thereof; and first and second terminal electrodes including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on the mounting surface of the MLCC in a facing manner.

According to another aspect of the present disclosure, a board having a multilayer ceramic electronic component may include: a circuit board having a plurality of electrode pads provided on an upper surface thereof; and a multilayer ceramic electronic component mounted on the circuit board, of which the lower horizontal portions of the terminal electrodes are bonded to the electrode pads of the circuit board.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, exemplary embodiments in the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity.

The same reference numerals will be used throughout to designate the same or like elements.

Multilayer Ceramic Electronic Component

Figure 1:
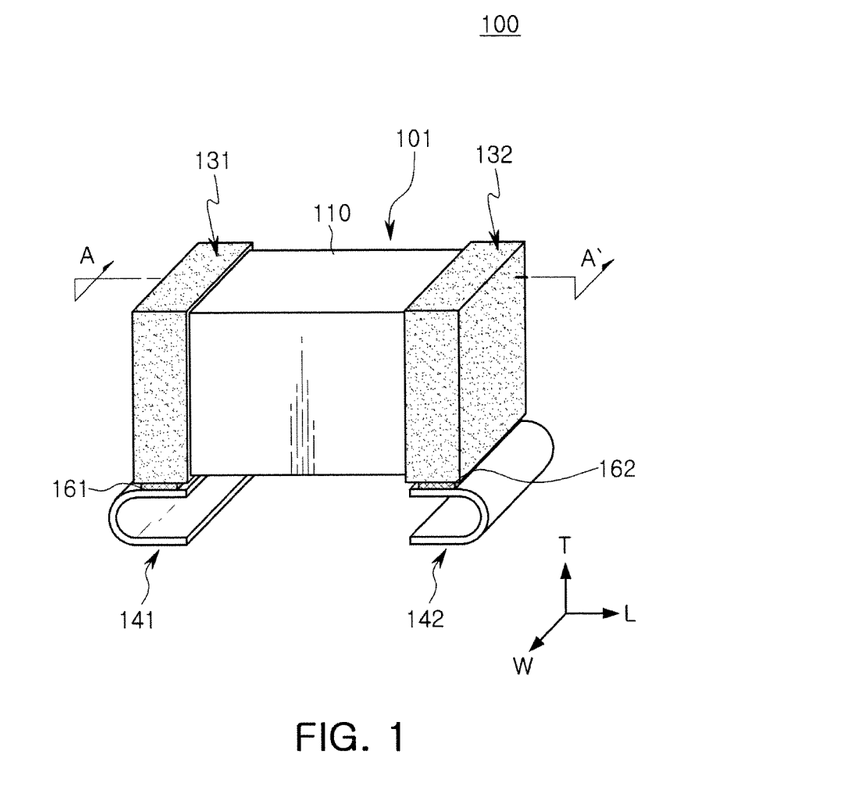
FIG. 1 is a perspective view schematically illustrating a multilayer ceramic electronic component according to an exemplary embodiment in the present disclosure.
Figure 2:
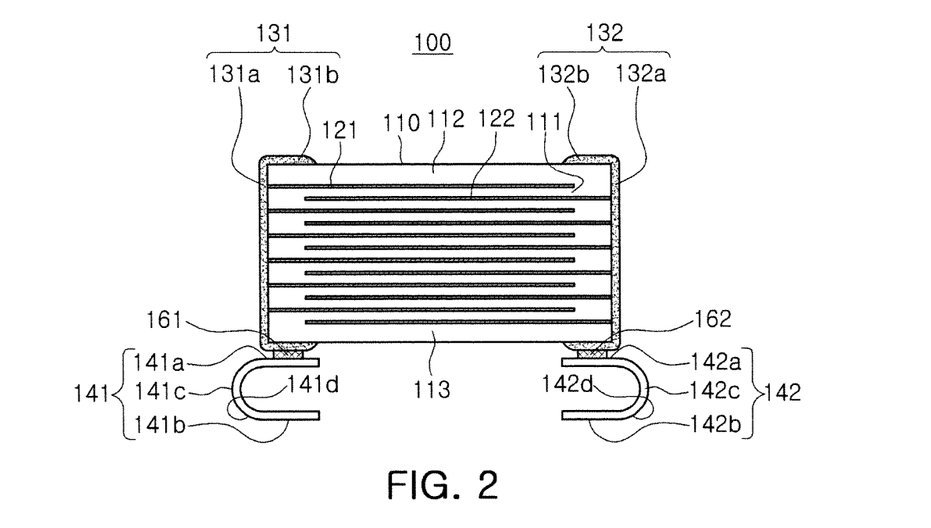
FIG. 2 is a cross-sectional view taken along line A-A' of FIG. 1.
Figure 3:
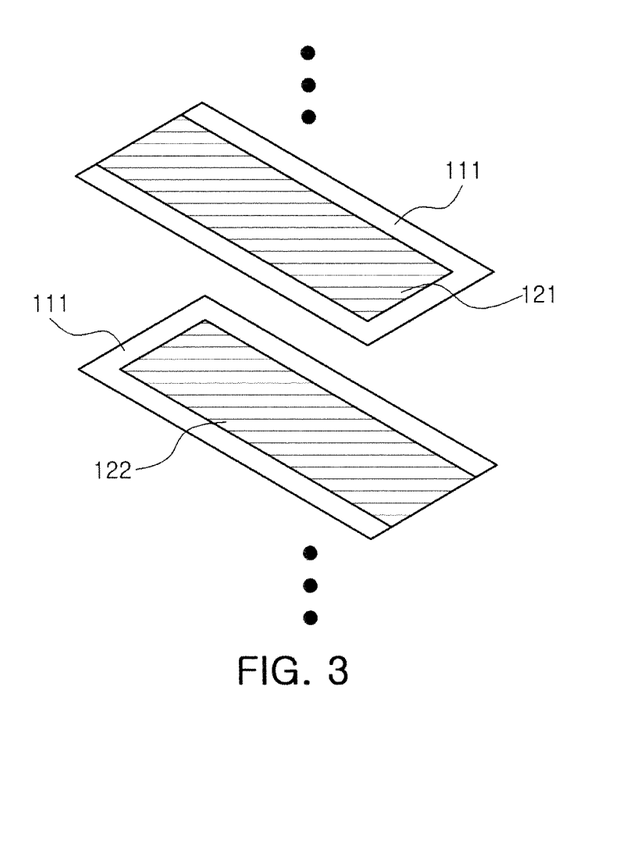
FIG. 3 is an exploded perspective view illustrating an example of an internal electrode stacking structure of FIG. 2.

FIG. 1 is a perspective view schematically illustrating a multilayer ceramic electronic component according to an exemplary embodiment in the present disclosure, FIG. 2 is a cross-sectional view taken along line A-A' of FIG. 1, and FIG. 3 is an exploded perspective view illustrating an example of an internal electrode stacking structure of FIG. 2.

Referring to FIGS. 1 through 3, a multilayer ceramic electronic component 10 includes a multilayer ceramic capacitor (MLCC) 101 and first and second terminal electrodes 141 and 142.

The MLCC 101 may include a ceramic body 110; first and second internal electrodes 121 and 122, and first and second external electrodes 131 and 132 disposed to be spaced apart from one another on a mounting surface of the ceramic body 110.

The MLCC 100 of the present exemplary embodiment may further include first and second conductive bonding layers 161 and 162.

The first and second conductive bonding layers 161 and 162 electrically connect the first and second external electrodes 131 and 132 and the first and second terminal electrodes 141 and 142.

The ceramic body 110 of the present exemplary embodiment is formed by stacking a plurality of dielectric layers in a thickness T direction and subsequently sintering the same.

Here, adjacent dielectric layers 111 may be integrated such that boundaries therebetween may not be readily apparent.

The ceramic body 110 may have a hexahedral shape, but the shape of the ceramic body 110 is not limited thereto.

In the present exemplary embodiment, for the purposes of description, surfaces of the ceramic body 110 opposing one another in the thickness T direction in which the dielectric layers 111 of the ceramic body 110 are stacked are defined as upper and lower surfaces, surfaces of the ceramic body 110 opposing one another in a length L direction of the ceramic body 110 connecting the upper and lower surfaces are defined as first and second end surfaces, and surfaces of the ceramic body 110 opposing one another in a width W direction perpendicular to the first and second end surfaces are defined as first and second side surfaces.

In the ceramic body 110, an upper cover layer 112 having a predetermined thickness may be formed above the uppermost internal electrode, and a lower cover layer 113 may be formed below the lowermost internal electrode.

Here, the upper cover layer 112 and the lower cover layer 113 may have the same composition as that of the dielectric layers 111, and may be formed by stacking at least one dielectric layer, without an internal electrode, above the uppermost internal electrode and below the lowermost internal electrode of the ceramic body 110, respectively.

The dielectric layer 111 may be formed of ceramic material having a high-k high dielectric material. For example, the dielectric layer 111 may include a barium titanate ($BaTiO_3$)-based ceramic material, or the like, but a material of the dielectric layer 111 is not limited thereto.

The $BaTiO_3$-based ceramic material may include, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which calcium (Ca), zirconium (Zr), and the like, are partially employed in $BaTiO_3$, but the $BaTiO_3$-based ceramic material is not limited thereto.

The dielectric layer 111 may further include a ceramic additive, an organic solvent, a plasticizer, a binder, a dispersant, and the like.

As the ceramic additive, a transition metal oxide or carbide, a rare earth element, magnesium (Mg), aluminum (Al), and the like, may be used.

The first and second internal electrodes 121 and 122 are formed on ceramic sheets forming the dielectric layers 111, stacked, and subsequently sintered to be alternately disposed with one dielectric layer 111 interposed therebetween within the ceramic body 110 in the thickness direction.

The first and second internal electrodes 121 and 122 have opposing polarities and are disposed to face each other in the direction in which the dielectric layers 111 are stacked, and may be electrically insulated from one another by the dielectric layers 11 interposed therebetween.

One ends of the first and second internal electrodes 121 and 122 are exposed to the first and second end surfaces of the ceramic body 110.

The end portions of the first and second internal electrodes 121 and 122 alternately exposed to the first and second end surfaces of the ceramic body 110 may be electrically connected to the first and second external electrodes 131 and 132 on the first and second end surfaces of the ceramic body 110.

Here, the first and second internal electrodes 121 and 122 are formed of a conductive metal. For example, the first and second internal electrodes 121 and 122 may be formed of a material such as nickel (Ni) or a nickel (Ni) alloy, but the material of the first and second internal electrodes 121 and 122 is not limited thereto.

When a predetermined voltage is applied to the first and second external electrodes 131 and 132, electric charges are accumulated between the first and second internal electrodes 121 and 122 facing one another.

Here, capacitance of the MLCC 101 is in proportion to an overlap area in which the first and second internal electrodes 121 and 122 overlap with each other in the stacking direction of the dielectric layers 111.

The first and second external electrodes 131 and 132 are disposed on both end portions of the ceramic body 110 in the length direction, and include first and second main portions 131a and 132a and first and second band portions 131b and 132b, respectively.

The first and second main portions 131a and 132a cover the first and second end surfaces of the ceramic body 110 and electrically connected to the exposed end portions of the first and second internal electrodes 121 and 122, respectively.

The first and second band portions 131b and 132b extend from the first and second main portions 131a and 132a to cover portions of the circumferential surface of the ceramic body 110, respectively.

A plating layer (not shown) may be formed on the first and second external electrodes 131 and 132. The plating layer may include first and second nickel (Ni) plating layers respectively formed on the first and second external electrodes 131 and 132, and first and second tin (Sn) plating layers respectively formed on the first and second nickel plating layers.

Figure 4:
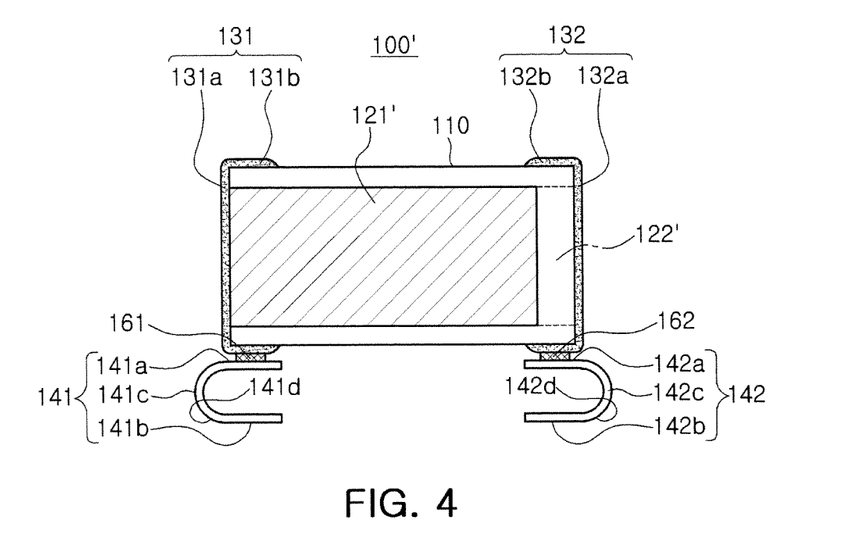
FIG. 4 is a cross-sectional view schematically illustrating a multilayer ceramic electronic component according to another exemplary embodiment in the present disclosure.
Figure 5:
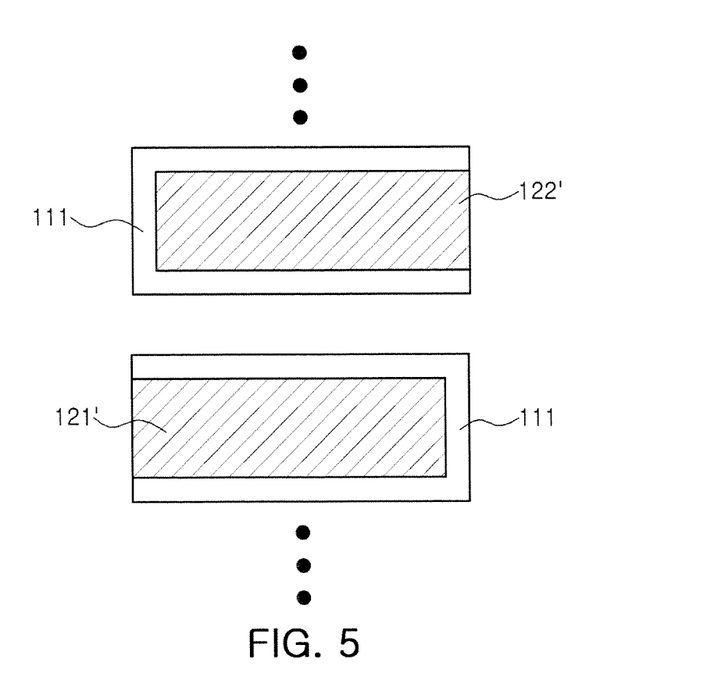
FIG. 5 is an exploded perspective view illustrating an example of an internal electrode stacking structure of FIG. 4.

FIG. 4 is a cross-sectional view schematically illustrating a multilayer ceramic electronic component 100' according to another exemplary embodiment in the present disclosure, and FIG. 5 is an exploded perspective view illustrating an example of an internal electrode stacking structure of FIG. 4.

Referring to FIGS. 4 and 5, a ceramic body 110 according to the present exemplary embodiment may include a plurality of dielectric layers 111 stacked in the width W direction.

Here, first and second internal electrodes 121' and 122' are formed on ceramic sheets forming the dielectric layers 111, stacked, and subsequently sintered to be alternately disposed with one dielectric layer 111 interposed therebetween within the ceramic body 110 in the width direction.

Figure 6:
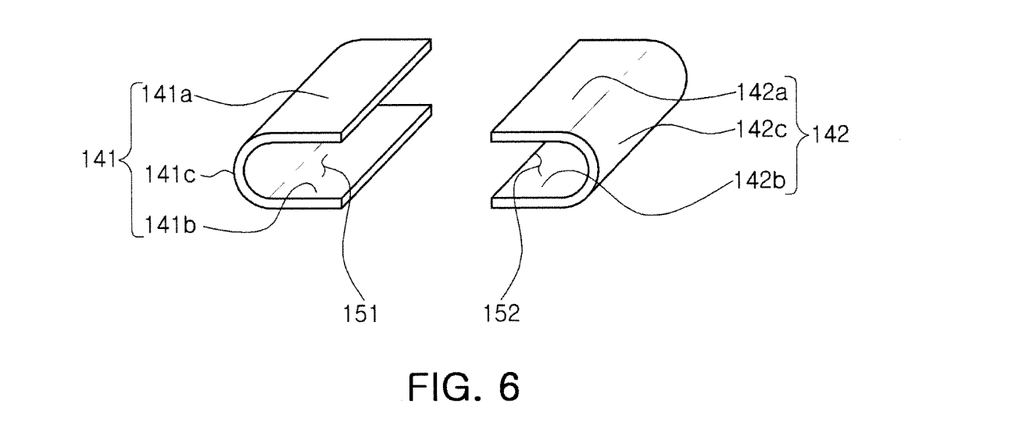
FIG. 6 is a perspective view schematically illustrating terminal electrodes according to an exemplary embodiment in the present disclosure.

Referring to FIG. 6, a first terminal electrode 141 includes a first upper horizontal portion 141a, a first lower horizontal portion 141b, and a first vertical portion 141c.

The first upper horizontal portion 141a is disposed below a lower surface of the first band portion 131b of the first external electrode 131.

The first lower horizontal portion 141b faces the first upper horizontal portion 141a in the thickness direction, and is disposed below the first upper horizontal portion 141a and spaced apart from the first upper horizontal portion.

The first vertical portion 141c connects an outer end portion of the first upper horizontal portion 141a and an outer end portion of the first lower horizontal portion 141b.

Here, the first vertical portion 141c may have a curve outwardly convex in the length direction of the ceramic body 110.

Curvature of the first vertical portion 141c of the first terminal electrode 141 is 100 μm or greater, and the first vertical portion 141c may be equal to or less than half of the overall thickness of the MLCC 101 including the ceramic body 110 and the first and second external electrodes 131 and 132.

Here, if the curvature of the first vertical portion 141c is less than 100 μm, vibration absorption on the basis of elastic force of the first terminal electrode 141 may not be smoothly made so piezoelectric vibration transmitted from the capacitor may be introduced as is to a board, or the like, and if the curvature of the first vertical portion 141c exceeds half of the overall thickness of the MLCC 101 including the ceramic body 110 and the first and second external electrodes 131 and 132, a height of the overall chip is so high that the chip collapses, causing a tombstone phenomenon, for example.

The first vertical portion 141c may be positioned outwardly of the main portion 131a of the first external electrode 131 in the length direction of the ceramic body.

According to the configuration of the first upper horizontal portion 141a, the first lower horizontal portion 141b, and the first vertical portion 141c, the first terminal electrode 141 may have a first recess portion 151 oriented to the interior of the ceramic body 110 in the length direction.

Thus, the first terminal electrode 141 may have a substantially "⊂" shape.

The first terminal electrode 141 may absorb a partial amount of mechanical vibrations generated due to piezoelectric characteristics of the MLCC 101 by virtue of the elastic force thereof, reducing an amount of vibrations transmitted to the board to reduce acoustic noise.

In particular, vibrations generated in the MLCC 101 may be concentratedly canceled out in the first vertical portion 141c formed as the curve surface of the first terminal electrode 141, reducing vibrations transmitted to the board.

When the MLCC 101 is mounted on the board, solder bonds the first terminal electrode 141 and the board, and here, the first vertical portion 141c separates the MLCC 101 to a predetermined height from the board and the solder is accommodated in a first recess 141d provided in a lower end due to the curve of the first vertical portion 141c, whereby the solder is prevented from climbing up the first vertical portion 141c of the first terminal electrode 141 to be in direct contact with the first external electrode 131, further reducing acoustic noise.

The second terminal electrode 142 includes a second upper horizontal portion 142a, a second lower horizontal portion 142b, and a second vertical portion 142c.

The second upper horizontal portion 141a is disposed below a lower surface of the second band portion 132b of the second external electrode 132.

The second lower horizontal portion 142b faces the second upper horizontal portion 142a in the thickness direction, and is disposed below the second upper horizontal portion 142a and spaced apart from the second upper horizontal portion 142a.

The second vertical portion 142c connects an outer end portion of the second upper horizontal portion 142a and an outer end portion of the second lower horizontal portion 142b.

Here, the second vertical portion 142c may have a curve outwardly convex in the length direction of the ceramic body 110.

Curvature of the second vertical portion 142c of the second terminal electrode 142 is 100 μm or greater, and the second vertical portion 142c may be equal to or less than half of the overall thickness of the MLCC 101 including the ceramic body 110 and the first and second external electrodes 131 and 132.

Here, if the curvature of the second vertical portion 142c is less than 100 μm, vibration absorption on the basis of elastic force of the first terminal electrode 142 may not be smoothly made so piezoelectric vibration transmitted from the capacitor may be introduced as is to a board, or the like, and if the curvature of the second vertical portion 142c exceeds half of the overall thickness of the MLCC 101 including the ceramic body 110 and the first and second external electrodes 131 and 132, a height of the overall chip is so high that the chip collapses, causing a tombstone phenomenon, for example.

The first vertical portion 142c may be positioned outwardly of the main portion 132a of the second external electrode 132 in the length direction of the ceramic body.

According to the configuration of the second upper horizontal portion 142a, the second lower horizontal portion 142b, and the second vertical portion 142c, the second terminal electrode 142 may have a second recess portion 152 oriented to the interior of the ceramic body 110 in the length direction.

Thus, the second terminal electrode 142 may have a substantially "⊃" shape.

The second terminal electrode 142 may absorb a partial amount of mechanical vibrations generated due to piezoelectric characteristics of the MLCC 101 by virtue of the elastic force thereof, reducing an amount of vibrations transmitted to the board to reduce acoustic noise.

In particular, vibrations generated in the MLCC 101 may be concentratedly canceled out in the second vertical portion 142c formed as the curve surface of the second terminal electrode 142, reducing vibrations transmitted to the board.

When the MLCC 101 is mounted on the board, solder bonds the second terminal electrode 142 and the board, and here, the second vertical portion 142c separates the MLCC 101 to a predetermined height from the board and the solder is accommodated in a second recess 142d provided in a lower end due to the curve of the second vertical portion 142c, whereby the solder is prevented from climbing up the second vertical portion 142c of the second terminal electrode 142 to be in direct contact with the second external electrode 132, further reducing acoustic noise.

Figure 7:
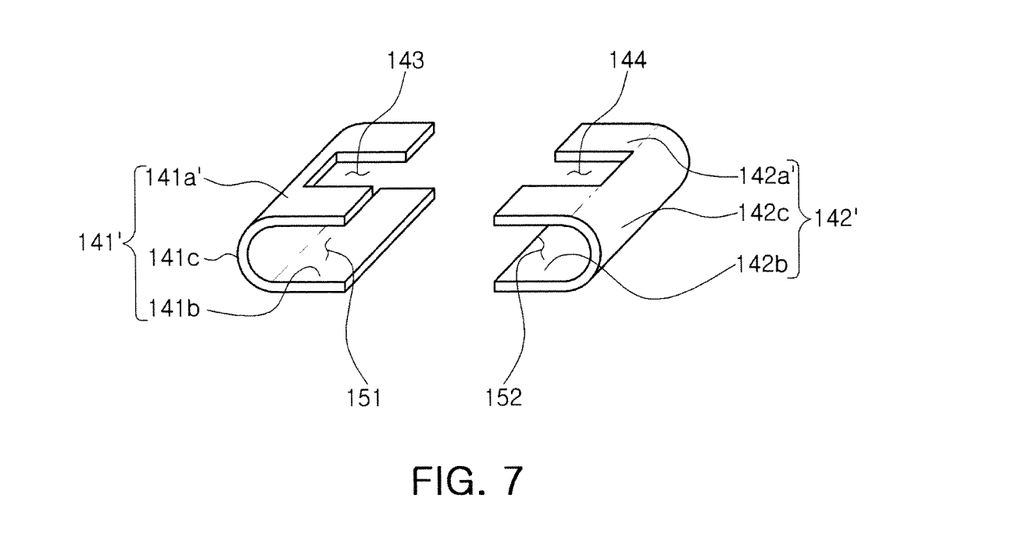
FIG. 7 is a perspective view schematically illustrating terminal electrodes according to another exemplary embodiment in the present disclosure.

FIG. 7 is a perspective view schematically illustrating another exemplary embodiment of terminal electrodes 141' and 142'.

Referring to FIG. 7, a first terminal electrode 141' includes a first upper horizontal portion 141a', a first lower horizontal portion 141b and a first vertical portion 141c as a curve.

A first recess 143 may be formed in the first upper horizontal portion 141a'.

The first recess 143 may be formed as a cutaway recess open toward the interior of the ceramic body 110 in the length direction.

The first recess 143 may reduce an area in which the first terminal electrode 141' and the first external electrode 131 are in contact, reducing an amount of vibrations transmitted from the MLCC 101 to the board.

The area of the first recess 143 of the first upper horizontal portion 141a' may be less than 50% of the area of the first upper horizontal portion 141a'.

Here, if the area of the first recess 143 is 50% or greater of the first upper horizontal portion 141a', adhesive strength between the MLCC 101 and the first terminal electrode 141' may be lowered, and thus, when external impact is applied to the MLCC 101 mounted on the board, the chip may be easily released.

The second terminal electrode 142' includes a second upper horizontal portion 142a', a second lower horizontal portion 142b and a second vertical portion 142c as a curve.

A second recess 144 may be formed in the second upper horizontal portion 142a'.

The second recess 144 may be formed as a cutaway recess open toward the interior of the ceramic body 110 in the length direction.

The second recess 144 may reduce an area in which the second terminal electrode 142' and the second external electrode 132 are in contact, reducing an amount of vibrations transmitted from the MLCC 101 to the board.

The area of the second recess 144 of the second upper horizontal portion 142a' may be less than 50% of the area of the second upper horizontal portion 142a'.

Here, if the area of the second recess 144 is 50% or greater of the second upper horizontal portion 142a', bonding strength between the MLCC 101 and the second terminal electrode 142' may be lowered, and thus, when external impact is applied to the MLCC 101 mounted on the board, the chip may be easily released.

Meanwhile, the first and second terminal electrodes 141 and 142 may be formed of a board coated with various conductive materials such as a metal having conductivity, a resin or a metal such as conductive epoxy, or the like, but the material of the terminal electrodes of the present exemplary embodiment is not limited thereto.

In the present exemplary embodiment, the first and second conductive bonding layer 161 and 162 are interposed between lower surfaces of the first and second band portions 131b and 132b of the first and second external electrodes 131 and 132 and the first and second upper horizontal portions 141a and 142a of the first and second terminal electrodes 141 and 142 to electrically connect the first and second external electrodes 131 and 132 and the first and second terminal electrodes 141 and 142.

Here, the first and second conductive bonding layers 161 and 162 may be formed of high melting point solder or conductive paste, but the material of the first and second conductive bonding layers 161 and 162 is not limited thereto.

The area of the first and second conductive bonding layers 161 and 162 may be smaller than the area of the first and second upper horizontal portions 141a and 142a.

When the area of the first and second conductive bonding layers 161 and 162 is minimized, an amount of vibrations directly transmitted from the MLCC to the first and second terminal electrodes 141 and 142 may be reduced, resulting in a reduction in acoustic noise.

Here, since the first and second external electrodes 131 and 132 and the first and second terminal electrodes 141 and 142 are in surface contact by the first and second conductive bonding layers 161 and 162, eliminating a problem in terms of adhesive strength.

According to the present exemplary embodiment, when voltages having different polarities are applied to the first and second external electrodes 131 and 132 formed on the first and second end surfaces of the ceramic body 110 in a state in which the MLCC 101 is mounted on the board, the ceramic body 110 expands and contracts in the thickness direction due to an inverse piezoelectric effect of the dielectric layers 111 and the first and second end surfaces of the ceramic body 110 on which the first and second external electrodes 131 and 132 are formed contract and expand, opposite to the expansion and contraction of the ceramic body 110 in the thickness direction due to poisson effect.

Here, the since first and second terminal electrodes 141 and 142 secure a predetermined gap between the MLCC 101 and the board, the first and second external electrodes 131 and 132 are not in direct contact with each other and a partial amount of vibrations transmitted to the board through the first and second external electrodes 131 and 132 of the MLCC 101 may be absorbed by elastic force of the first and second terminal electrodes 141 and 142, thus reducing acoustic noise.

Also, the first and second terminal electrodes 141 and 142 may absorb mechanical stress generated due to bowing of the board, or the like, and impact transmitted from the outside, preventing transmission of stress to the MLCC 101, and thus, generation of cracks of the MLCC 101 may be prevented.

Modified Example

Figure 8:
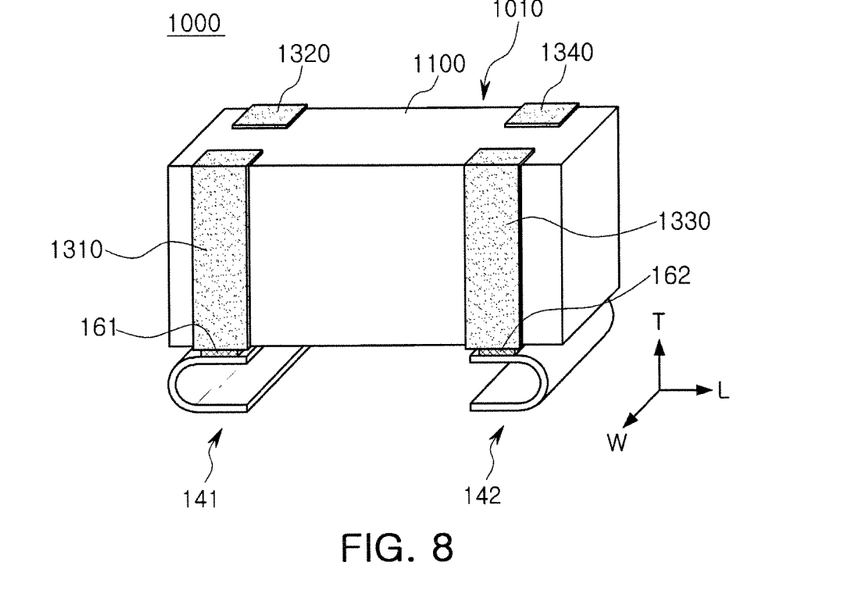
FIG. 8 is a perspective view schematically illustrating a multilayer ceramic electronic component according to another exemplary embodiment in the present disclosure.
Figure 9:
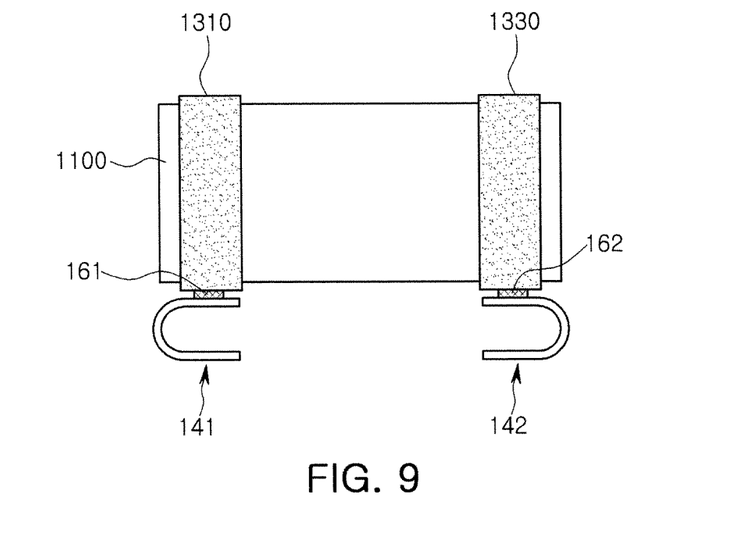
FIG. 9 is a side view of the multilayer ceramic electronic component of FIG. 8.
Figure 10:
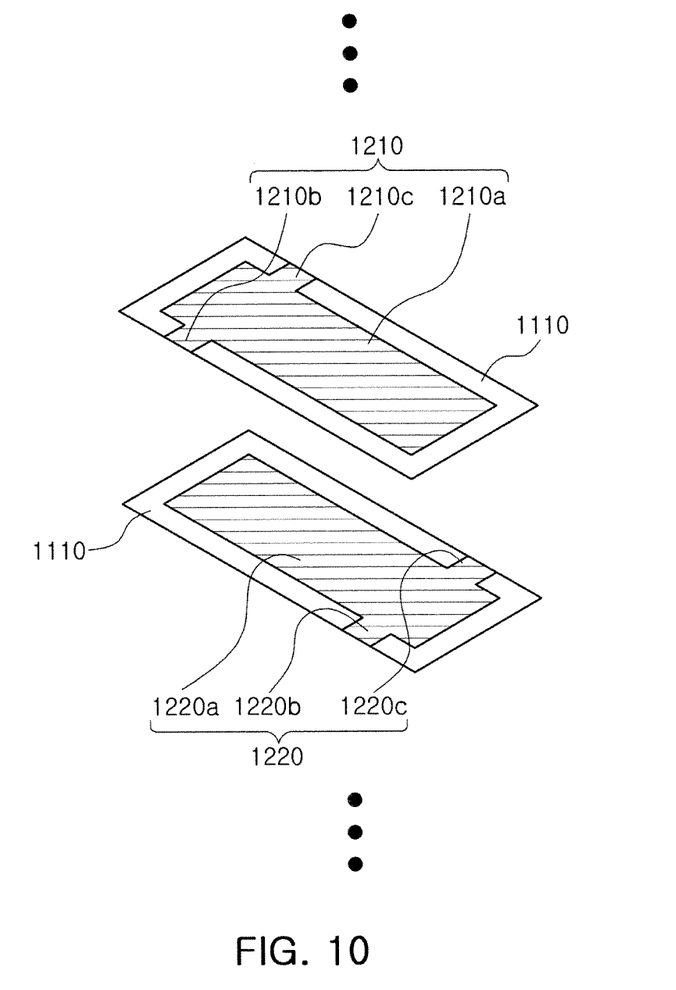
FIG. 10 is an exploded perspective view illustrating an example of internal electrodes of the multilayer ceramic electronic component of FIG. 8.

FIG. 8 is a perspective view schematically illustrating a multilayer ceramic electronic component according to another exemplary embodiment in the present disclosure, FIG. 9 is a side view of the multilayer ceramic electronic component of FIG. 8, and FIG. 10 is an exploded perspective view illustrating an exemplary embodiment of internal electrodes of the multilayer ceramic electronic component of FIG. 8.

Here, a structure of first and second terminal electrodes 141 and 142 of a multilayer ceramic electronic component 1000 is similar to that of the exemplary embodiment described above, and thus, a detailed description thereof will be omitted so as to avoid a repeated description, and a changed structure of an MLCC 1010 different from that of the previous exemplary embodiment described above will be described in detail.

Referring to FIGS. 8 through 10, the MLCC 1010 according to the present exemplary embodiment includes: a ceramic body 1100; a plurality of first and second internal electrodes 1210 and 1220; first and second external electrodes 1310 and 1320 connected to the first internal electrode 1210 and third and fourth external electrodes 1330 and 1340 connected to the second internal electrode 1220.

The ceramic body 1100 includes a plurality of dielectric layers 1110 stacked in the thickness direction.

The first and second internal electrodes 1210 and 1220 are alternately disposed with the dielectric layers 1110 interposed therebetween within the ceramic body 1100.

The first internal electrode 1210 may include a first body portion 1210a and first and second lead-out portions 1210b and 1210c extending from the first body portion 1210a to both sides in the width direction in a facing manner.

The first and second lead-out portions 1210b and 1210c may be exposed to both side surfaces of the ceramic body 1100.

The second internal electrode 1220 may include a second body portion 1220a overlapping the first body portion 1210a vertically and third and fourth lead-out portions 1220b and 1220c extending from the second body portion 1220a to both sides in the width direction in a facing manner.

The third and fourth lead-out portions 1220b and 1220c may be disposed in positions spaced apart from the first and second lead-out portions 1210b and 1210c in the length direction of the ceramic body 1100 and may be exposed to both side surfaces of the ceramic body 1100, respectively.

The first and second external electrodes 1310 and 1320 may be disposed to extend from both side surfaces of the ceramic body 1100 to portions of a lower surface, a mounting surface, of the ceramic body 1100, respectively.

The first and second external electrodes 1310 and 1320 may be in contact with the exposed end portions of the first and second lead-out portions 1210b and 1210c and electrically connected thereto, respectively.

Portions of the first and second external electrodes 1310 and 1320 disposed on a lower surface of the ceramic body 1100 may be disposed on the first upper horizontal portion 141a of the first terminal electrode 141 and may be electrically connected to each other by the first conductive bonding layer 161.

Here, the first and second external electrodes 1310 and 1320 may extend to portions of the upper surface of the ceramic body 1100, opposing the mounting surface of the ceramic body 1100, as necessary, in order to enhance adhesive strength, or the like.

The third and fourth external electrodes 1330 and 1340 may be disposed in positions spaced apart from the first and second external electrodes 1310 and 1320 in the length direction of the ceramic body 1100 and may extend from both side surfaces of the ceramic body 1100 to portions of the lower surface of the ceramic body 1100, the mounting surface of the ceramic body 1100, so as to be disposed, respectively.

The third and fourth external electrodes 1330 and 1340 may be in contact with exposed end portions of the third and fourth lead-out portions 1220b and 1220c and electrically connected thereto, respectively.

Portions of the third and fourth external electrodes 1330 and 1340 disposed on the lower surface of the ceramic body 1100 may be disposed on the first upper horizontal portion 142a of the second terminal electrode 142 and may be electrically connected to each other by the second conductive bonding layer 162.

Here, the third and fourth external electrodes 1330 and 1340 may extend to portions of the upper surface of the ceramic body 1100, opposing the mounting surface of the ceramic body 1100, as necessary, in order to enhance adhesive strength, or the like.

Figure 11:
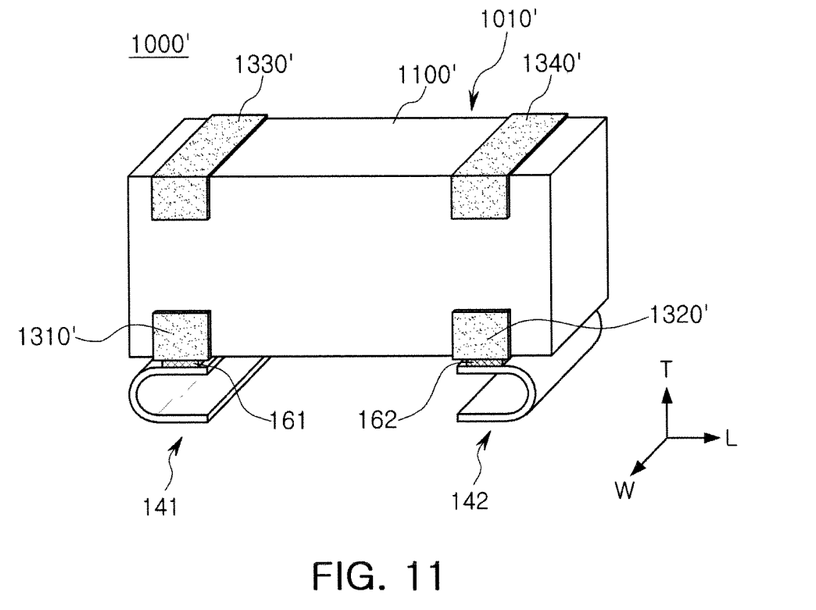
FIG. 11 is a perspective view schematically illustrating a multilayer ceramic electronic component according to another exemplary embodiment in the present disclosure.
Figure 12:
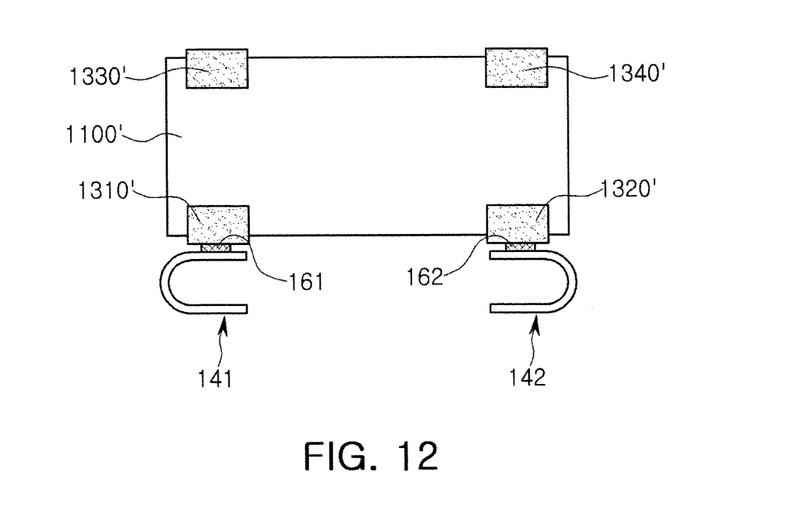
FIG. 12 is a side view of the multilayer ceramic electronic component of FIG. 11.
Figure 13:
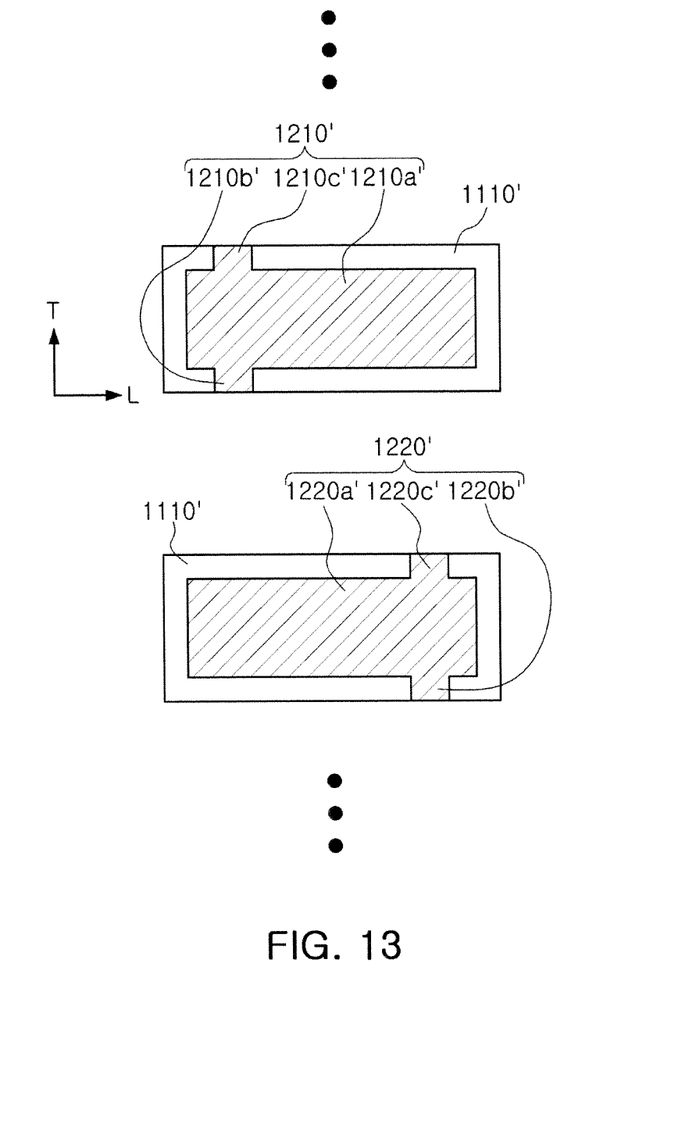
FIG. 13 is an exploded perspective view illustrating an example of internal electrodes of the multilayer ceramic electronic component of FIG. 11.

FIG. 11 is a perspective view schematically illustrating a multilayer ceramic electronic component according to another exemplary embodiment in the present disclosure, FIG. 12 is a side view of the multilayer ceramic electronic component of FIG. 11, and FIG. 13 is an exploded perspective view illustrating an exemplary embodiment of internal electrodes of the multilayer ceramic electronic component of FIG. 11.

Here, a structure of first and second terminal electrodes 141 and 142 of a multilayer ceramic electronic component 1000' is similar to that of the exemplary embodiment described above, and thus, a detailed description thereof will be omitted so as to avoid a repeated description, and a changed structure of an MLCC 1010' different from that of the previous exemplary embodiment described above will be described in detail.

Referring to FIGS. 11 through 13, the MLCC 1010' according to the present exemplary embodiment includes: a ceramic body 1100'; a plurality of first and second internal electrodes 1210' and 1220'; first and second external electrodes 1310' and 1320' respectively connected to the first and second internal electrode 1210' and 1220'.

The ceramic body 1100' includes a plurality of dielectric layers 1110' stacked in the width direction.

The first and second internal electrodes 1210' and 1220' are alternately disposed with the dielectric layers 1110' interposed therebetween within the ceramic body 1100'.

The first internal electrodes 1210' may include a first body portion 1210a' and a first lead-out portion 1210b' extending from the first body portion 1210a' and exposed to the lower surface of the ceramic body 1100'.

The second internal electrodes 1220' may include a second body portion 1220a' and a second lead-out portion 1220b' extending from the second body portion 1220a' and exposed to the lower surface of the ceramic body 1100'.

The second lead-out portion 1220b' is disposed to be spaced apart from the first lead-out portion 1210b' in the length direction of the ceramic body 1100'.

The first and second external electrodes 1310' and 1320' may be disposed to be spaced apart from one another on the lower surface of the ceramic body 1100'.

Also, the first and second external electrodes 1310' and 1320' may be in contact with exposed end portions of the first and second lead-out portions 1210b' and 1220b' and electrically connected thereto, respectively.

Here, the first and second external electrodes 1310' and 1320' may extend to portions of both side surfaces of the ceramic body 1100, as necessary, in order to enhance adhesive strength, or the like.

The first external electrode 1310' may be disposed on the first upper horizontal portion 141a of the first terminal electrode 141 and may be electrically connected to each other by the first conductive bonding layer 161.

The second external electrode 1320' may be disposed on the second upper horizontal portion 142a of the second terminal electrode 142 and may be electrically connected to each other by the second conductive bonding layer 162.

The first internal electrode 1210' may further include a third lead-out portion 1210c' extending from the first body portion 1210a' and exposed to the upper surface of the ceramic body 1100', if necessary.

The second internal electrode 1212' may further include a fourth lead-out portion 1220c' extending from the second body portion 1220a' and exposed to the upper surface the ceramic body 1100', if necessary.

Here, the fourth lead-out portion 1220c' is disposed in a position spaced apart from the third lead-out portion 1210c' in the length direction of the ceramic body 1100'.

Here, the third and fourth external electrodes 1330' and 1340' may be disposed to be spaced apart from one another on the upper surface of the ceramic body 1100'.

The third and fourth external electrodes 1330' and 1340' are in contact with the exposed end portions of the third and fourth lead-out portions 1210c' and 1220c' and electrically connected thereto, respectively.

Also, the third and fourth external electrodes 1330' and 1340' may extend to portions of both side surfaces of the ceramic body 1100', if necessary, in order to enhance adhesive strength, or the like.

Board Having Multilayer Ceramic Electronic Component

Figure 14:
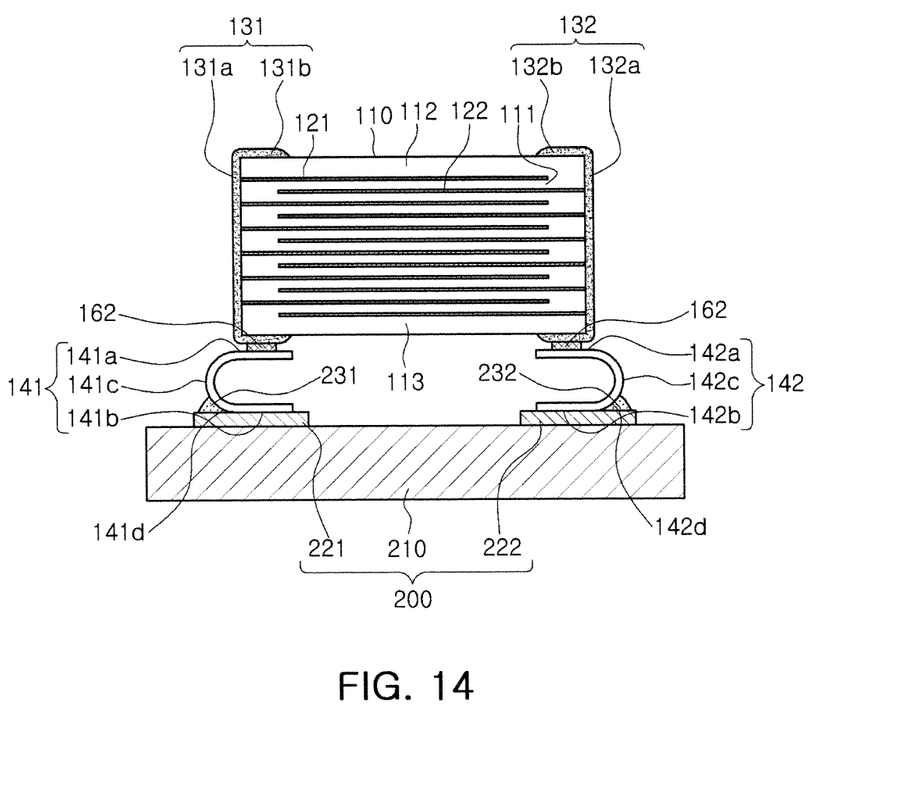
FIG. 14 is a cross-sectional view illustrating a board in which the multilayer ceramic electronic component of FIG. 1 mounted on a circuit board.

Referring to FIG. 14, a board 200 having a multilayer ceramic electronic component according to an exemplary embodiment includes a circuit board 210 on which a multilayer ceramic electronic component is horizontally mounted and first and second electrode pads 221 and 222 spaced apart from one another on an upper surface of the circuit board 210.

In a state in which first and second lower horizontal portions 141b and 142b of the first and second terminal electrodes 141 and 142 are positioned to be in contact with the first and second electrode pads 221 and 222, respectively, the multilayer ceramic electronic component may be electrically connected to the circuit board 210 by solders 231 and 232.

When a voltage is applied in the state in which the multilayer ceramic electronic component mounted on the circuit board 210, acoustic noise may be generated.

Here, a size of the first and second electrode pads 221 and 222 may be an indicator for determining an amount of the solders 231 and 232 connecting the first and second terminal electrodes 141 and 142 of the multilayer ceramic electronic component to the first and second electrode pads 221 and 222, and a magnitude of acoustic noise may be adjusted depending on the amount of solders 231 and 232.

Also, the first and second terminal electrodes 141 and 142 of the multilayer ceramic electronic component may absorb mechanical stress generated due to bowing of the circuit board 210, or the like, preventing transmission of stress to the MLCC 101, and thus, damage such as cracks may be prevented.

Figure 15:
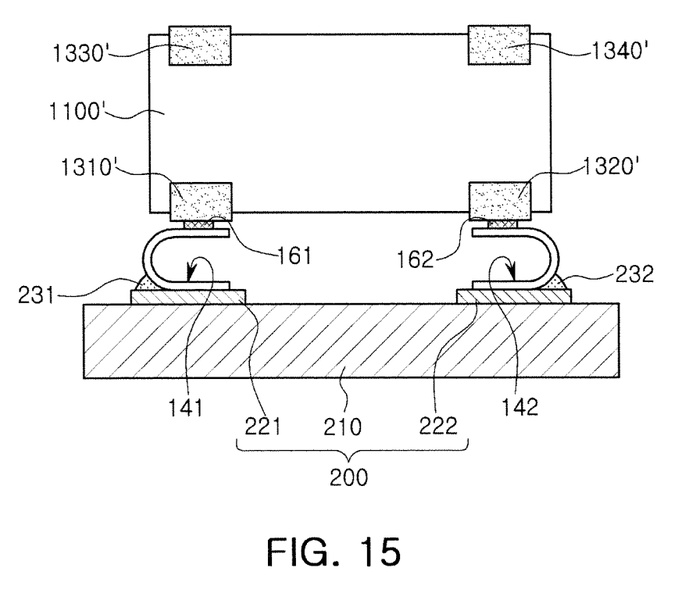
FIG. 15 is a cross-sectional view illustrating the multilayer ceramic electronic component of FIG. 11 mounted on a circuit board.

FIG. 15 is a cross-sectional view illustrating a board having a multilayer ceramic electronic component according to another exemplary embodiment in the present disclosure. Here, the board has a structure similar to that of the previous exemplary embodiment described above, except for a structure of an MLCC, and thus, a detailed description thereof will be omitted.

As set forth above, according to exemplary embodiments of the present disclosure, a portion of vibrations transmitted through external electrodes of the ceramic body is absorbed by elastic force of the terminal electrodes, a predetermined gap is secured between the MLCC and the circuit board, the solders are accommodated in outer recesses of a lower end formed due to the curved vertical portions of the terminal electrodes, the height of the solders may be lowered, and the solders are not in direct contact with the external electrodes, reducing acoustic noise.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a multilayer ceramic capacitor (MLCC) including first and second external electrodes disposed to be spaced apart from one another on a mounting surface thereof; and
first and second terminal electrodes respectively including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on the mounting surface of the MLCC in a facing manner, wherein all bends in the first and second terminal electrodes are curved.

2. The multilayer ceramic electronic component of claim 1, further comprising first and second conductive bonding layers respectively interposed between the lower surfaces of the first and second external electrodes and the upper horizontal portions of the first and second terminal electrodes.

3. The multilayer ceramic electronic component of claim 2, wherein the first and second conductive bonding layers are smaller than the upper horizontal portions of the first and second terminal electrodes.

4. The multilayer ceramic electronic component of claim 1, wherein the upper horizontal portions of the first and second terminal electrodes have recesses, respectively.

5. The multilayer ceramic electronic component of claim 4, wherein the recesses are opened inwardly while facing each other.

6. The multilayer ceramic electronic component of claim 4, wherein the recesses are less than 50% of areas of the upper horizontal portions.

7. The multilayer ceramic electronic component of claim 1, wherein curvatures of the vertical portions of the first and second terminal electrodes are equal to or more than 100 μm or greater and are equal to or less than half of an overall thickness of the MLCC including a ceramic body of the MLCC and the first and second external electrodes.

8. A multilayer ceramic electronic component comprising:
a multilayer ceramic capacitor (MLCC) including first and second external electrodes disposed to be spaced apart from one another on a mounting surface thereof; and
first and second terminal electrodes respectively including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on the mounting surface of the MLCC in a facing manner, wherein all bends in the first and second terminal electrodes are curved.

9. The multilayer ceramic electronic component of claim 8, further comprising first and second conductive bonding layers respectively interposed between the lower surfaces of the first and second band portions of the first and second external electrodes and the upper horizontal portions of the first and second terminal electrodes.

10. The multilayer ceramic electronic component of claim 9, wherein the first and second conductive bonding layers are smaller than the upper horizontal portions of the first and second terminal electrodes.

11. The multilayer ceramic electronic component of claim 8, wherein the upper horizontal portions of the first and second terminal electrodes have recesses, respectively.

12. The multilayer ceramic electronic component of claim 11, wherein the recesses are opened inwardly while facing each other.

13. The multilayer ceramic electronic component of claim 11, wherein the recesses are less than 50% of areas of the upper horizontal portions.

14. The multilayer ceramic electronic component of claim 8, wherein curvatures of the vertical portions of the first and second terminal electrodes are equal to or more than 100 μm or greater and are equal to or less than half of an overall thickness of the MLCC including the ceramic body and the first and second external electrodes.

15. The multilayer ceramic electronic component of claim 8, further comprising cover layers disposed on an uppermost internal electrode and below a lowermost internal electrode within the ceramic body.

16. A multilayer ceramic electronic component comprising:
  a multilayer ceramic capacitor (MLCC) including:
    a ceramic body including a plurality of dielectric layers stacked in a thickness direction thereof;
    a plurality of first internal electrodes each having first and second lead-out portions respectively exposed to both side surfaces of the ceramic body;
    a plurality of second internal electrodes alternately disposed with the plurality of first internal electrodes with the dielectric layers interposed therebetween within the ceramic body, and having third and fourth lead-out portions exposed to both side surfaces of the ceramic body and disposed to be spaced apart from the first and second lead-out portions in a length direction of the ceramic body;
    first and second external electrodes disposed to extend from both side surfaces of the ceramic body to portions of a lower surface of the ceramic body and connected to the first and second lead-out portions, respectively; and
    third and fourth external electrodes disposed to extend from both side surfaces of the ceramic body to portions of the lower surface of the ceramic body and connected to the third and fourth lead-out portions, respectively; and
  first and second terminal electrodes respectively including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on a mounting surface of the MLCC in a facing manner, wherein all bends in the first and second terminal electrodes are curved.

17. The multilayer ceramic electronic component of claim 16, further comprising:
  a first conductive bonding layer interposed between the first and second external electrodes and the upper horizontal portion of the first terminal electrode; and
  a second conductive bonding layer interposed between the third and fourth external electrodes and the upper horizontal portion of the second terminal electrode.

18. The multilayer ceramic electronic component of claim 17, wherein the first and second conductive bonding layers are smaller than the upper horizontal portions of the first and second terminal electrodes.

19. The multilayer ceramic electronic component of claim 16, wherein the upper horizontal portions of the first and second terminal electrodes have recesses, respectively.

20. The multilayer ceramic electronic component of claim 19, wherein the recesses are opened inwardly while facing each other.

21. The multilayer ceramic electronic component of claim 19, wherein the recesses are less than 50% of areas of the upper horizontal portions.

22. The multilayer ceramic electronic component of claim 16, wherein curvatures of the vertical portions of the first and second terminal electrodes are equal to or more than 100 μm or greater and are equal to or less than half of an overall thickness of the MLCC including the ceramic body and the first and second external electrodes.

23. The multilayer ceramic electronic component of claim 16, further comprising cover layers disposed on an uppermost internal electrode and below a lowermost internal electrode within the ceramic body.

24. A multilayer ceramic electronic component comprising:
  a multilayer ceramic capacitor (MLCC) including:
    a ceramic body including a plurality of dielectric layers stacked in a width direction thereof;
    a plurality of first internal electrodes each having a first lead-out portion exposed to a lower surface of the ceramic body;
    a plurality of second internal electrodes alternately disposed with the plurality of first internal electrodes with the dielectric layers interposed therebetween within the ceramic body, and each having a second lead-out portion exposed to the lower surface of the ceramic body and disposed to be spaced apart from the first lead-out portion in a length direction of the ceramic body; and
    first and second external electrodes disposed to be spaced apart from one another on the lower surface of the ceramic body and connected to the first and second lead-out portions, respectively; and
  first and second terminal electrodes respectively including upper horizontal portions disposed on lower surfaces of the first and second external electrodes, lower horizontal portions disposed to be spaced apart from the upper horizontal portions downwardly, and curved vertical portions connecting one ends of the upper horizontal portions and one ends of the lower horizontal portions, having "⊂" and "⊃" shapes, and disposed on a mounting surface of the MLCC in a facing manner, wherein all bends in the first and second terminal electrodes are curved.

25. The multilayer ceramic electronic component of claim 24, further comprising first and second conductive bonding layers respectively interposed between the lower surfaces of the first and second external electrodes and the upper horizontal portions of the first and second terminal electrodes.

26. The multilayer ceramic electronic component of claim 25, wherein the first and second conductive bonding layers are smaller than the upper horizontal portions of the first and second terminal electrodes.

27. The multilayer ceramic electronic component of claim 24, wherein the first and second external electrodes extend from the lower surface of the ceramic body to portions of both side surfaces of the ceramic body.

28. The multilayer ceramic electronic component of claim 24, further comprising third and fourth external electrodes disposed to be spaced apart from one another on an upper surface of the ceramic body,
   wherein each of the plurality of first internal electrodes has a third lead-out portion exposed to the upper surface of the ceramic body and connected to the third external electrode, and
   each of the plurality of second internal electrodes has a fourth lead-out portion exposed to the upper surface of the ceramic body and connected to the fourth external electrode.

29. The multilayer ceramic electronic component of claim 28, wherein the third and fourth external electrodes extend from the upper surface of the ceramic body to portions of both side surfaces of the ceramic body.

30. The multilayer ceramic electronic component of claim 24, wherein the upper horizontal portions of the first and second terminal electrodes have recesses, respectively.

31. The multilayer ceramic electronic component of claim 30, wherein the recesses are opened inwardly while facing each other.

32. The multilayer ceramic electronic component of claim 30, wherein the recesses are less than 50% of areas of the upper horizontal portions.

33. The multilayer ceramic electronic component of claim 24, wherein curvatures of the vertical portions of the first and second terminal electrodes are equal to or more than 100 µm and are equal to or less than half of an overall thickness of the MLCC including the ceramic body and the first and second external electrodes.

34. A board having a multilayer ceramic electronic component, the board comprising:
   a circuit board having a plurality of electrode pads provided on an upper surface thereof; and
   a multilayer ceramic electronic component of claim 1, of which the lower horizontal portions of the terminal electrodes are bonded to the electrode pads of the circuit board.

35. A board having a multilayer ceramic electronic component, the board comprising:
   a circuit board having a plurality of electrode pads provided on an upper surface thereof; and
   a multilayer ceramic electronic component of claim 8, of which the lower horizontal portions of the terminal electrodes are bonded to the electrode pads of the circuit board.

36. A board having a multilayer ceramic electronic component, the board comprising:
   a circuit board having a plurality of electrode pads provided on an upper surface thereof; and
   a multilayer ceramic electronic component of claim 16, of which the lower horizontal portions of the terminal electrodes are bonded to the electrode pads of the circuit board.

37. A board having a multilayer ceramic electronic component, the board comprising:
   a circuit board having a plurality of electrode pads provided on an upper surface thereof; and
   a multilayer ceramic electronic component of claim 24, of which the lower horizontal portions of the terminal electrodes are bonded to the electrode pads of the circuit board.

* * * * *